United States Patent
Meng et al.

(10) Patent No.: US 11,308,308 B2
(45) Date of Patent: Apr. 19, 2022

(54) FINGERPRINT RECOGNITION DEVICE, RECOGNITION DEVICE AND DISPLAY DEVICE

(71) Applicant: BOE TECHNOLOGY GROUP CO., LTD., Beijing (CN)

(72) Inventors: Xiandong Meng, Beijing (CN); Wei Wang, Beijing (CN); Xiaochuan Chen, Beijing (CN); Haisheng Wang, Beijing (CN); Pinchao Gu, Beijing (CN); Jian Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 288 days.

(21) Appl. No.: 16/494,938

(22) PCT Filed: Apr. 3, 2019

(86) PCT No.: PCT/CN2019/081308
§ 371 (c)(1),
(2) Date: Sep. 17, 2019

(87) PCT Pub. No.: WO2019/196724
PCT Pub. Date: Oct. 17, 2019

(65) Prior Publication Data
US 2021/0334508 A1 Oct. 28, 2021

(30) Foreign Application Priority Data

Apr. 11, 2018 (CN) .......................... 201810318613.8

(51) Int. Cl.
*G06K 9/00* (2022.01)
*H01L 27/32* (2006.01)

(52) U.S. Cl.
CPC ....... *G06K 9/00046* (2013.01); *G06K 9/0004* (2013.01); *H01L 27/323* (2013.01)

(58) Field of Classification Search
None
See application file for complete search history.

(56) References Cited

U.S. PATENT DOCUMENTS 5,448,659 A * 9/1995 Tsutsui ................. G02B 6/1221
385/14
10,627,550 B2 4/2020 Liu et al.
(Continued)

FOREIGN PATENT DOCUMENTS

CN 107479128 A 12/2017
CN 107527039 A 12/2017
(Continued)

OTHER PUBLICATIONS

International Search Report of PCT/CN2019/081308 in Chinese, dated Jun. 18, 2019, with English translation.
(Continued)

*Primary Examiner* — Joseph R Haley
(74) *Attorney, Agent, or Firm* — Collard & Roe, P.C.

(57) ABSTRACT

A fingerprint recognition device, a recognition device and a display device are provided to include: a light guiding layer and a plurality of recognizer units, on a side of a light transmission substrate. Each recognizer unit includes: a first optical grating which is between the light guiding layer and the light transmission substrate and is configured to diffractively couple a fingerprint light ray having an incident angle within a preset angle range to the light guiding layer; a second optical grating on a side of the light guiding layer; and a detector module on a side of the second optical grating away from the light guiding layer. The second optical grating is configured to extract the fingerprint light ray in the light guiding layer to the detector module, and the detector module is configured to detect a light intensity of the fingerprint light ray.

20 Claims, 2 Drawing Sheets (56) References Cited

U.S. PATENT DOCUMENTS

| | | | |
|---|---|---|---|
| 2006/0119837 A1* | 6/2006 | Raguin | G06K 9/00046 |
| | | | 356/71 |
| 2016/0140380 A1* | 5/2016 | Carver | G06K 9/0004 |
| | | | 382/124 |
| 2016/0283773 A1* | 9/2016 | Popovich | G02B 6/0026 |
| 2018/0129798 A1* | 5/2018 | He | G06F 21/32 |
| 2019/0086599 A1 | 3/2019 | Meng et al. | |
| 2020/0302146 A1* | 9/2020 | Bjerre | G06K 9/00355 |

FOREIGN PATENT DOCUMENTS

| | | |
|---|---|---|
| CN | 107657231 A | 2/2018 |
| CN | 108520240 A | 9/2018 |

OTHER PUBLICATIONS

Chinese Office Action in Chinese Application No. 201810318613.8 with Supplementary Search with English translation.

\* cited by examiner

FINGERPRINT RECOGNITION DEVICE, RECOGNITION DEVICE AND DISPLAY DEVICE

CROSS-REFERENCES TO RELATED APPLICATIONS

This application is the National Stage of PCT/CN2019/081308 filed on Apr. 3, 2019, which claims priority under 35 U.S.C. § 119 of Chinese Application No. 201810318613.8 filed on Apr. 11, 2018, the disclosure of which is incorporated by reference.

TECHNICAL FIELD

Embodiments of the present disclosure relate to a fingerprint recognition device, a recognition device and a display device.

BACKGROUND

With rapid development of display technology, functions of a display device are gradually increasing. For example, in addition to an image display function, the display device also has a fingerprint recognition function to increase the security of the display device and the convenience of the fingerprint verification.

SUMMARY

In one aspect, the embodiments of the present disclosure provide a fingerprint recognition device, and the fingerprint recognition device includes: a light transmission substrate; a light guiding layer on a side of the light transmission substrate; and a plurality of recognizer units on the light guiding layer. Each of the recognizer units includes a first optical grating, a second optical grating and a detector module; the first optical grating is arranged between the light guiding layer and the light transmission substrate, and the first optical grating is configured to diffractively couple a fingerprint light ray having an incident angle within a preset angle range to the light guiding layer so that the fingerprint light ray is transmitted in the light guiding layer; the second optical grating is arranged on a side of the light guiding layer, the detector module is arranged on a side of the second optical grating away from the light guiding layer, and the second optical grating is configured to extract the fingerprint light ray in the light guiding layer to the detector module; and the detector module is configured to detect a light intensity of the fingerprint light ray extracted from the light guiding layer by the second optical grating.

For example, both the first optical grating and the second optical grating are in direct contact with the light guiding layer.

For example, the first optical grating and the second optical grating are adjacent to each other and are arranged on a same side of the light guiding layer.

For example, the detector module is configured to detect the fingerprint light ray extracted only from the light guiding layer.

For example, the detector module includes a photosensitive layer and a light shielding layer, the photosensitive layer is located between the light shielding layer and the light guiding layer, and the light shielding layer shields the photosensitive layer.

For example, the second optical grating is arranged on a side of the light guiding layer away from the first optical grating.

For example, an orthographic projection of the second optical grating on the light guiding layer overlaps an orthographic projection of the detector module on the light guiding layer.

For example, the preset angle range of the incident angle of the fingerprint light ray is from −7 degrees to +4 degrees.

For example, the first optical grating each includes a plurality of light entrance grating strips arranged side by side, each light entrance grating strip is configured to diffractively couple the fingerprint light ray from a position corresponding to the light entrance strip into the light guiding layer to allow the fingerprint light ray to be transmitted in the light guiding layer; the second optical grating each includes a plurality of light exit grating strips arranged side by side, each light exit grating strip is configured to extract the fingerprint light ray from the light guiding layer to the detector module to allow the detector module to detect the light intensity of the fingerprint light ray.

For example, each light entrance grating strip and each light exit grating strip are inclined grating strips.

For example, an included angle between each light entrance grating strip and a normal perpendicular to the light guiding layer ranges from 10 degrees to 30 degrees, an included angle between each light exit grating strip and the normal perpendicular to the light guiding layer ranges from 10 degrees to 30 degrees, a height of each light entrance grating strip and a height of each light exit grating strip range from 400 nm to 500 nm.

For example, the light transmission substrate is an organic light-emitting diode (OLED) display substrate.

For example, the OLED display substrate includes a light transmission base layer and a light-emitting layer, the light-emitting layer is arranged on a side of a plurality of first optical gratings away from the light guiding layer, and the light transmission base layer is arranged on a side of the light-emitting layer away from the light guiding layer.

For example, the light transmission substrate is an active light-emitting substrate.

For example, the light guiding layer is arranged on a back side of the active light-emitting substrate.

For example, the fingerprint light ray guided into the light guiding layer by the first optical grating is totally reflected to the second optical grating by a surface which is included by the light guiding layer and is away from the first optical grating.

For example, a thickness of the light guiding layer is less than or equal to 50 microns.

For example, in a direction in which the plurality of recognizer units are arranged, a width of each recognizer unit is less than a sum of a width of a fingerprint valley of a fingerprint and a width of a fingerprint ridge of the fingerprint.

In another aspect, the embodiments of the present disclosure further provide a recognition device, and the recognition device includes: a light transmission substrate; a light guiding layer on a side of the light transmission substrate; and a plurality of recognizer units on the light guiding layer. Each of the recognizer units includes a first optical grating, a second optical grating and a detector module; the first optical grating is arranged between the light guiding layer and the light transmission substrate, and the first optical grating is configured to diffractively couple a light ray having an incident angle within a preset angle range to the light guiding layer so that the light ray is transmitted in the light guiding layer; the second optical grating is arranged on a side of the light guiding layer, the detector module is arranged on a side of the second optical grating away from the light guiding layer, and the second optical grating is configured to extract the light ray in the light guiding layer to the detector module; and the detector module is configured to detect a light intensity of the light ray extracted from the light guiding layer by the second optical grating.

In still another aspect, the embodiments of the present disclosure further provide a display device, and the display device includes: the fingerprint recognition device or the recognition device.

BRIEF DESCRIPTION OF THE DRAWINGS

In order to clearly illustrate the technical solution of embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but to distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Specific embodiments, structures, features and functions of a fingerprint recognition device, a recognition device and a display device according to the embodiments of the present disclosure are described in detail below with reference to the accompanying drawings and preferred embodiments.

In the research, the inventors of the present disclosure note that a structure for fingerprint recognition in a current display device generally includes a pinhole light filter structure a lens and a grating structure, although fingerprint information is obtained by such structure, the structure of the display device is too complicated, which results in an overall thickness of the display device to be too thick.

Figure 1:
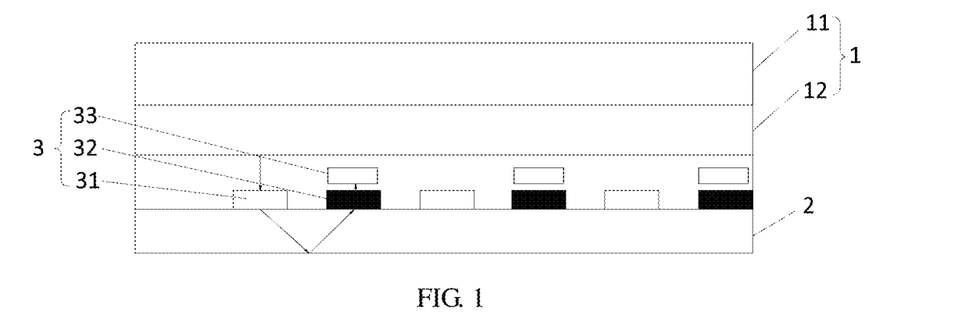
FIG. 1 is a schematic structural view of a fingerprint recognition device provided by an embodiment of the present disclosure.
Figure 2:
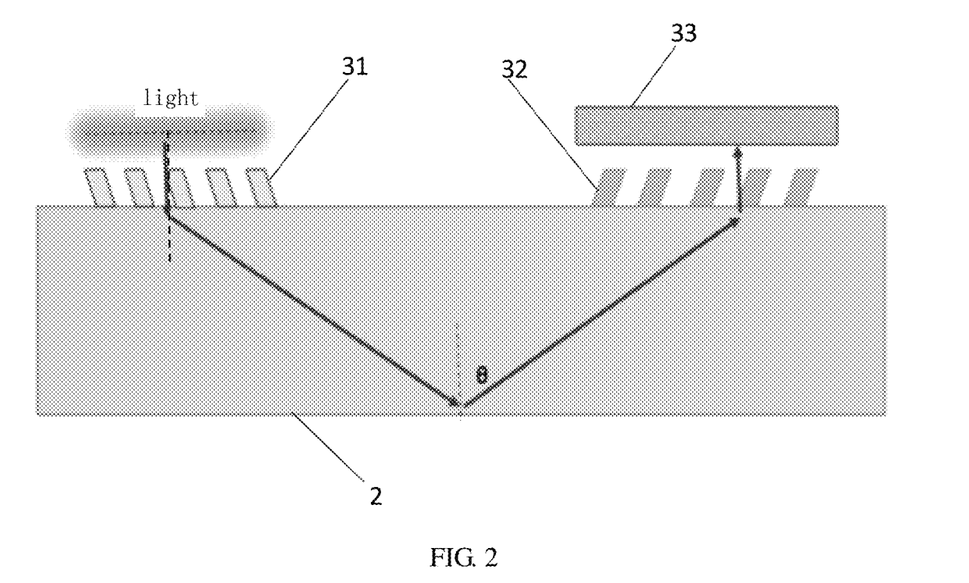
FIG. 2 is a principle diagram of the fingerprint recognition device provided by an embodiment of the present disclosure.
Figure 3:
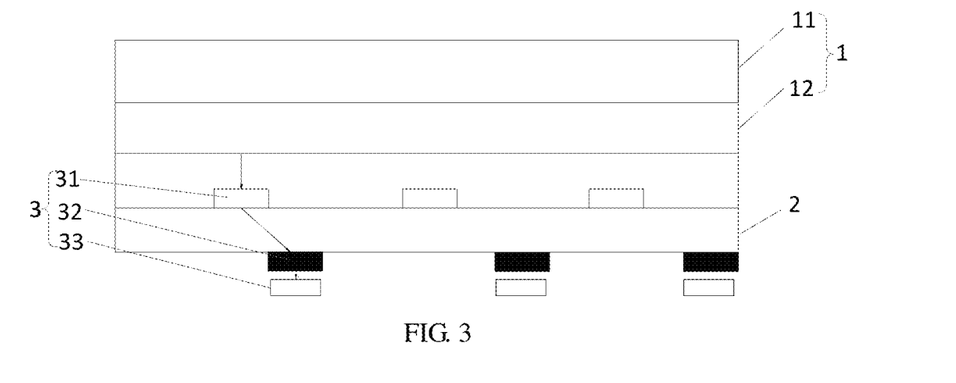
FIG. 3 is another schematic structural view of the fingerprint recognition device provided by an embodiment of the present disclosure.

As illustrated in FIG. 1, FIG. 2 and FIG. 3, the embodiments of the present disclosure provide a fingerprint recognition device, the fingerprint recognition device includes a light transmission substrate 1, a light guiding layer 2 and a plurality of recognizer units 3, and the light guiding layer 2 is arranged on a side of the light transmission substrate 1; the plurality of recognizer units 3 are arranged on the light guiding layer 2, and each recognizer unit 3 includes a first optical grating 31, a second optical grating 32 and a detector module 33. In the fingerprint recognition device, the first optical grating 31 is arranged between the light guiding layer 2 and the light transmission substrate 1, and the first optical grating is used to diffractively couple a fingerprint light ray (the fingerprint light ray is a light ray having fingerprint information, for example, the fingerprint light ray is a light ray reflected by a fingerprint) having an incident angle within a preset angle range to the light guiding layer 2 so that the fingerprint light ray is transmitted in the light guiding layer 2; the second optical grating 32 is arranged on a side of the light guiding layer 2, and the second optical grating 32 is used to extract the fingerprint light ray in the light guiding layer 2 to the detector module 33; the detector module 33 is arranged on a side of the second optical grating 32 away from the light guiding layer 2, and the detector module 33 is used to detect a light intensity of the fingerprint light ray extracted from the light guiding layer 2 by the second optical grating 32.

In the embodiments of the present disclosure, the light transmission substrate 1 is used for acquiring the fingerprint information. In a situation where fingerprint recognition verification is required, a user's finger touches the light transmission substrate 1, the light ray reflected by the fingerprint of the finger (for example, the fingerprint light ray) passes through the light transmission substrate 1 and is transmitted to the above mentioned recognizer units 3, and the fingerprint is obtained by the recognizer units 3 and the light guiding layer 2.

In the embodiments of the present disclosure, each of the plurality of recognizer units is used to accurately obtain the fingerprint light ray at a position corresponding to the fingerprint, and the fingerprint light ray is firstly guided into the light guiding layer 2, then is extracted from the light guiding layer 2, and then is transmitted to the detector module 33. The intensity of the fingerprint light ray is detected by the detector module 33, whether the fingerprint at the position is a peak (a fingerprint ridge) or a valley (a fingerprint valley) is judged based on the intensity of the fingerprint light ray, and thus a fingerprint information graphic is obtained, so as to realize identity recognition and verification.

Each recognizer unit 3, for example, includes the first optical grating 31, the second optical grating 32 and the detector module 33, and each recognizer unit 3 performs fingerprint recognition only on a preset region which is included by the fingerprint and is corresponding to the recognizer unit 3, so that complete fingerprint information of the fingerprint of the finger is recognized via the plurality of recognizer units 3 to ensure the accuracy of fingerprint recognition; it can also be understood that each recognizer unit 3 recognizes only a small part of a region corresponding to the fingerprint of the finger (the small part of the region is the preset region which is, for example, the fingerprint valley or the fingerprint ridge).

For example, in order to facilitate that each recognizer unit 3 recognizes only the small part of the region corresponding to the fingerprint of the finger, in a direction in which the plurality of recognizer units 3 are arranged (for example, a horizontal direction in FIG. 1 and FIG. 3), a width of each recognizer unit 3 is smaller than a sum of a width of the fingerprint valley of the fingerprint and a width of the fingerprint ridge of the fingerprint. The width of each recognizer unit 3 is a distance from an edge which is included by the first optical grating 31 and is away from the second optical grating 32 to an edge which is included by the second optical grating 32 and is away from the first optical grating 31. For example, each recognizer unit 3 has the width of less than 500 microns in the direction in which the plurality of recognizer units 3 are arranged; for example, the width is less than 400 microns, or for example, the width is less than 300 microns.

For example, in order to avoid the influence of other regions on the recognizer unit 3, the first optical grating 31 is designed so that the first optical grating 31 diffractively couples the fingerprint light ray in only the preset region corresponding to this first optical grating 31 into the light guiding layer 2, so that the fingerprint light ray is transmitted in the light guiding layer 2; the fingerprint light rays in the other regions are not totally reflected in the light guiding layer 2 due to angles of the fingerprint light rays, and thus the fingerprint light rays in the other regions cannot be transmitted in the light guiding layer 2. The second optical grating 32 is mainly used to extract the fingerprint light ray transmitted in the light guiding layer 2; based on the design of the second optical grating 32, the second optical grating 32 is able to extract the fingerprint light ray which is diffractively coupled to the light guiding layer 2 only by the first optical grating 31 corresponding to the second optical grating 32, then the intensity of the extracted fingerprint light ray is detected by the detector module 33, and whether the preset region of the fingerprint of the finger corresponding to the fingerprint information is the peak or the valley is determined based on the intensity of the fingerprint light ray, so that the recognition of the fingerprint of the finger is realized.

For example, in the case that the finger touches the light transmission substrate 1, the fingerprint of the finger reflects the light ray (such as the light ray emitted from a light source included in the light transmission substrate 1) into the light transmission substrate 1, the light ray passes through the light transmission substrate 1 and then is irradiated into the first optical grating 31, and the first optical grating 31 diffractively couples only the fingerprint light ray having the incident angle within the preset angle range to the light guiding layer 2, so that the fingerprint light ray is transmitted in the light guiding layer 2. Then, the second optical grating 32 extracts the fingerprint light ray, which is guided into the light guiding layer 2 by the first optical grating 31 corresponding to the second optical grating 32 and then is reflected in the light guiding layer 2, and then transmits the fingerprint light ray to the detector module 33, and the intensity of the fingerprint light ray is detected by the detector module 33. If the intensity of the fingerprint light ray is greater than a preset value, it is determined that the fingerprint region corresponding to the fingerprint light ray, which has the incident angle within the preset angle range and is selected by the first optical grating 31, is the peak; if the intensity of the fingerprint light ray is less than the preset value, it is determined that the fingerprint region corresponding to the fingerprint light ray, which has the incident angle within the preset angle range and is selected by the first optical grating 31, is the valley. In this situation, the fingerprint information of the finger is obtained by the detection of the plurality of recognizer units.

The embodiments of the present disclosure provide the fingerprint recognition device, to realize that the structure of the fingerprint recognition device is simplified, so that the fingerprint recognition device is thinner and lighter. The fingerprint recognition device provided in the present disclosure includes the light transmission substrate, the light guiding layer and the plurality of recognizer units arranged on the light guiding layer; the recognizer unit includes the first optical grating, the second optical grating and the detector module; the first optical grating is arranged on one side of the light guiding layer, and the first optical grating is configured to diffractively couple the fingerprint light ray having the incident angle within the preset angle range to the light guiding layer, so that the fingerprint light ray is transmitted in the light guiding layer; the second optical grating is used to extract the fingerprint light ray in the light guiding layer to the detector module; the detector module is used to detect the light intensity of the fingerprint light ray; and whether the fingerprint region corresponding to the fingerprint light ray having the incident angle within the preset angle range is the peak or the valley is judged based on the intensity of the fingerprint light ray, and then the fingerprint information of the finger is obtained. The above structure is simpler and lighter, which not only reduces costs, but also improves user's experience.

The above recognizer units 3 may have a variety of arrangement modes. As illustrated in FIG. 1, for example, the first optical grating 31 and the second optical grating 32 are adjacent to each other and are arranged on the same side of the light guiding layer 2. In the present embodiment, the first optical grating 31 and the second optical grating 32 are, for example, arranged in a same layer and adjacent to each other side by side. A detection principle of this embodiment is as follows: the fingerprint light ray having the incident angle within the preset angle range is irradiated on the first optical grating 31; under the diffraction function of the first optical grating 31, the fingerprint light ray enters into the light guiding layer 2, reaches a bottom of the light guiding layer 2 (a lower surface of the light guiding layer 2), then is totally reflected (in this case, an angle θ in FIG. 2 is greater than or equal to a total reflection angle at the lower surface) by the bottom of the light guiding layer 2, and then is transmitted to a top of the light guiding layer 2; in a situation where the fingerprint light ray contacts the top of the light guiding layer 2, the fingerprint light ray is extracted from the light guiding layer 2 and then is transmitted to the detector module 33, by the second optical grating 32 disposed at the position where the fingerprint light ray contacts the top of the light guiding layer 2; the intensity of the fingerprint light ray is detected by the detector module 33, and thereby the fingerprint recognition is realized. In the above embodiment, a structure of the recognizer unit 3 is more compact, a space utilization rate is high, and a thickness of the fingerprint recognition device is reduced.

In the situation where the first optical grating 31 and the second optical grating 32 are arranged on the side of the light guiding layer 2 facing the light transmission substrate 1, a portion of the light ray reflected by the fingerprint may be irradiated on a surface which is included by the detector module 33 and faces the light transmission substrate 1 (an upper surface of the detector module 33 in FIG. 1), therefore in order to prevent the portion of the light ray from affecting a detection result of the detector module 33, for example, the detector module 33 is configured to detect the fingerprint light ray emitted only from the light guiding layer 2, that is, the detector module 33 detects the fingerprint light ray that is irradiated only onto another surface which is included by the detector module 33 and faces the light guiding layer 2 (a lower surface of the detector module 33 in FIG. 1).

Figure 4:
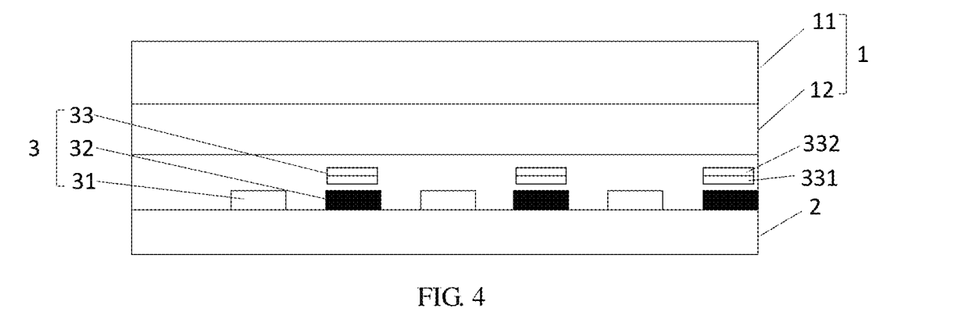
FIG. 4 is still another schematic structural view of the fingerprint recognition device provided by an embodiment of the present disclosure.

In order to enable the detector module 33 to detect the fingerprint light ray that is irradiated to only the lower surface of the detector module 33 to improve the accuracy of the fingerprint recognition, for example, as illustrated in FIG. 4, the detector module 33 includes a photosensitive layer 331 and a light shielding layer 332; the photosensitive layer 331 is located between the light shielding layer 332 and the light guiding layer 2, and the light shielding layer 332 shields the photosensitive layer 331. For example, the detector module 33 is a phototransistor, a photodiode or other type of photodetector.

The first optical grating 31 and the second optical grating 32 have other arrangement modes besides being disposed on the same side. As illustrated in FIG. 3, for example, the second optical grating 32 is arranged on a side of the light guiding layer 2 away from the first optical grating 31. In the present embodiment, one of the first optical grating 31 and the second optical grating 32 is arranged on a side of the light guiding layer 2, and the other one of the first optical grating 31 and the second optical grating 32 is arranged on the other side of the light guiding layer 2. As illustrated in FIG. 3, for example, the first optical grating 31 is arranged on an upper side of the light guiding layer 2, and the second optical grating 32 is arranged on a lower side of the light guiding layer 2. The detection principle of the present embodiment is as follows: the fingerprint light ray having the incident angle within the preset angle range is irradiated on the first optical grating 31; the first optical grating 31 is capable of diffractively coupling the fingerprint light ray into the light guiding layer 2 to transmit the fingerprint light ray from the upper side of the light guiding layer 2 to the lower side of the light guiding layer 2; in a situation where the fingerprint light ray contacts the lower side of the light guiding layer 2, the fingerprint light ray is extracted from the light guiding layer 2 and then is transmitted to the detector module 33, by the second optical grating 32 located at the lower side of the light guiding layer 2; and the intensity of the fingerprint light ray is detected by the detector module 33, and thereby the fingerprint recognition is achieved. The above structure is more convenient to be arranged and the structure is also very simple.

For example, in the embodiments shown in FIG. 1 and FIG. 3, no other film is arranged between the light guiding layer 2 and each of the first optical grating 31 and the second optical grating 32 (that is, each of the first optical grating 31 and the second optical grating 32 is in direct contact with the light guiding layer 2) to prevent the film from affecting the transmission direction of the fingerprint light ray.

For example, in the embodiments illustrated in FIG. 1 and FIG. 3, an orthographic projection of the second optical grating 32 on the light guiding layer 2 overlaps an orthographic projection of the detector module 33 on the light guiding layer 2, which facilitates that the fingerprint light ray emitted from the second optical grating 32 is incident to the detector module 33.

The preset angle range of the incident angle of the fingerprint light ray is various. For example, the preset angle range of the incident angle of the fingerprint light ray is from −7 degrees to +4 degrees. In the present embodiment, on one hand, in a situation where the incident angle is within such angle range, the verticality of the fingerprint light ray is good, so as to facilitate that each recognizer unit recognizes only one fingerprint valley or one fingerprint ridge, that is to say, it is helpful to avoid that the fingerprint light ray from the same fingerprint valley or the same fingerprint ridge are recognized by more recognizer units 3, so that the accuracy of fingerprint recognition is increased. On the other hand, the fingerprint light ray having the incident angle in such preset angle range not only satisfies the condition of total reflection on the lower surface of the light guiding layer 2, but also has sufficient transmission energy. For example, in a situation where the first optical grating 31 has a grating period of 500 nm, a grating inclined angle (an included angle between a grating strip and a normal perpendicular to the light guiding layer 2) of 20 degrees, a duty cycle of 50% and a grating groove depth of 500 nm, the angle range of the incident angle that satisfies the condition of total reflection is from −24 degrees to +4 degrees, and the angle range of the incident angle that satisfies the energy requirement is from −7 degrees to +24 degrees, and an intersection of the two conditions is from −7 degrees to +4 degrees, so that the fingerprint light ray in this angle range can not only satisfy the condition of total reflection, but also ensure the diffraction energy. It should be noted that, a positive degree indicates that the fingerprint light ray is incident from a right side of the normal (as illustrated by the dotted line at the position of the first optical grating 31 in FIG. 2), and a negative degree indicates that the fingerprint light ray is incident from a left side of the normal.

The specific structures of the first optical gratings 31 and the second optical gratings 32 described above are various. For example, as illustrated in FIG. 2, each first optical grating 31 includes a plurality of light entrance grating strips arranged side by side, each light entrance grating strip is configured to diffractively couple the fingerprint light ray at a position corresponding to the light entrance grating strip into the light guiding layer 2, to allow the fingerprint light ray to be transmitted in the light guiding layer 2; each second optical grating 32 includes a plurality of light exit grating strips arranged side by side, each light exit grating strip is configured to extract the fingerprint light ray in the light guiding layer 2 to the detector module 33, so that the detector module 33 detects the light intensity of the fingerprint light ray.

In the present embodiment, for example, both the light entrance grating strips and the light exit grating strips are formed of transparent material; the fingerprint light ray is diffractively coupled to the light guiding layer 2 by the light entrance grating strips, and the fingerprint light ray in the light guiding layer 2 is extracted by the light exit grating strips to the detector module 33 which is configured for detecting the intensity of the fingerprint light ray.

For example, each light entrance grating strip and each light exit grating strip are inclined grating strips. For example, in the same recognizer unit, an inclined direction of the light entrance grating strips is opposite to an inclined direction of the light exit grating strips. In the present disclosure, the inclined grating strips facilitate the fingerprint light ray to be diffractively coupled to the light guiding layer 2 at the incident angle within the preset angle range, and enable the fingerprint light ray to be transmitted in the light guiding layer.

For example, the inclined angle of the light entrance grating strip (namely the inclined angle of the grating mentioned above) and a height of the light entrance grating strip (namely the groove depth of the grating mentioned above) are set, to allow the fingerprint light ray selected by the first optical grating 31 (the selected fingerprint light ray is able to enter the light guiding layer 2 and then be extracted to the detector module 33 by the second optical grating 32) to have a good verticality (for example, the incident angle of the selected fingerprint light ray is from −7 degrees to +4 degrees). For example, the light exit grating strip and the light entrance grating strip have the same inclined angle and height. For example, each light entrance grating strip and each light exit grating strip have the included angle ranging from 10 degrees to 30 degrees with respect to the normal perpendicular to the light guiding layer 2, each light entrance grating strip and each light exit grating strip each have the height ranging from 400 nm to 500 nm.

In at least one embodiment of the present disclosure, for example, the light transmission substrate 1 is an active light-emitting substrate, such as an organic light-emitting diode (OLED) substrate, a quantum dot light-emitting substrate or any other types of substrates capable of actively emitting light. In this case, for example, the light guiding layer 2 is located on a back side (a side that does not emit light) of the active light-emitting substrate, and the fingerprint reflects the light emitted by the active light-emitting substrate to form the fingerprint light ray.

For example, in any one of the embodiments of the present disclosure, a thickness of the light guiding layer 2 is in micron dimension; for example, the thickness of the light guiding layer 2 is less than or equal to 50 microns. Compared with the fingerprint recognition device including the pinhole light filter structure, the lens and the grating structure, the present embodiment of the present disclosure facilitates allowing the fingerprint recognition device to have a small thickness.

For example, the fingerprint recognition device also has a display function in addition to the fingerprint recognition. For example, the light transmission substrate 1 is an OLED display substrate. In the present embodiment, for example, the fingerprint light ray (formed by reflecting the light from the OLED by the finger) of the finger passes through the OLED display substrate and then is irradiated onto the recognizer units 3, so that the fingerprint recognition is performed; in addition, the image display is also performed by the OLED display substrate, which enriches the functions of the fingerprint recognition device.

For example, the OLED display substrate includes a light transmission base layer (which is a light transmission layer such as a glass layer, a plastic layer or a quartz layer) 11 and a light-emitting layer 12. The light-emitting layer 12 is arranged on a side of the plurality of first optical gratings 31 away from the light guiding layer 2, and the light transmission base layer 11 is arranged on a side of the light-emitting layer 12 away from the light guiding layer 2. In the present embodiment, the light transmission base layer 11 is arranged on an outermost side to protect internal structures of the display substrate, and the light-emitting layer 12 realizes image display by emitting light of different colors. In addition to the light-emitting layer 12 and the light transmission base layer 11, the display substrate can also have various other functional layers, and descriptions are omitted herein.

In another aspect, the embodiments of the present disclosure further provide a recognition device, and the recognition device includes the light transmission substrate, the light guiding layer and a plurality of recognizer units. The plurality of recognizer units are arranged on the light guiding layer, and each of the recognizer units includes the first optical grating, the second optical grating and the detector module. The first optical grating is arranged between the light guiding layer and the light transmission substrate, and the first optical grating is configured to diffractively couple a light ray having the incident angle within the preset angle range to the light guiding layer, so that the light ray is transmitted in the light guiding layer; the second optical grating is arranged on the side of the light guiding layer, the detector module is arranged on the side of the second optical grating away from the light guiding layer, the second optical grating is configured to extract the light ray in the light guiding layer to the detector module, and the detector module is configured to detect a light intensity of the light ray extracted from the light guiding layer by the second optical grating.

The arrangement manners of the light transmission substrate, the light guiding layer and the recognizer units in the recognition device can be referred to the relevant descriptions in the embodiments of the fingerprint recognition device, and repeated descriptions are omitted herein.

The recognition device may be used to recognize the fingerprint, a touch position or other information, which are not limited by the present embodiments of the present disclosure.

In still another aspect, the embodiments of the present disclosure provide a display device, and the display device includes the fingerprint recognition device or the recognition device mentioned above.

For example, the display device is: a display panel, a mobile phone, a tablet computer, a TV, a display, a notebook computer, a digital picture frame, a navigator and any other product or component having a display function.

The embodiments of the present disclosure provide the fingerprint recognition device, the recognition device and the display device to realize the simplification of the structure of the recognition device and to allow the recognition device to be thinner and lighter. The fingerprint recognition device in the embodiments of the present disclosure includes the light transmission substrate, the light guiding layer and the plurality of recognizer units arranged on the light guiding layer. Each of the recognizer units includes the first optical grating, the second optical grating and the detector module. The first optical grating is arranged on the side of the light guiding layer and is configured for diffractively coupling the fingerprint light ray having the incident angle within the preset angle range to the light guiding layer, so that the fingerprint light ray is transmitted in the light guiding layer. The second optical grating is used to extract the fingerprint light ray in the light guiding layer to the detector module. The detector module is used to detect the light intensity of the fingerprint light ray, whether the fingerprint region corresponding to the fingerprint light ray having the incident angle within the preset angle range is the peak or the valley is judged based on the intensity of the fingerprint light ray, and then the fingerprint information of the finger is obtained via the recognition function of the plurality of recognizer units. The above structure is simpler and lighter, not only reduces costs, but also improves user's experience.

What is described above is related to only the illustrative embodiments of the present disclosure and not limitative to the protection scope of the present application. The protection scope of the present application shall be defined by the accompanying claims.

What is claimed is:

1. A fingerprint recognition device, comprising:
   a light transmission substrate;
   a light guiding layer, wherein the light guiding layer is on a side of the light transmission substrate; and
   a plurality of recognizer units, wherein the plurality of recognizer units are on the side of the light transmission substrate, and each of the plurality of recognizer units comprises a first optical grating, a second optical grating and a detector module;
   wherein the first optical grating is between the light guiding layer and the light transmission substrate, and the first optical grating is configured to diffractively couple a fingerprint light ray having an incident angle within a preset angle range to the light guiding layer so that the fingerprint light ray is transmitted in the light guiding layer;
   the second optical grating is on a side of the light guiding layer, the detector module is on a side of the second optical grating away from the light guiding layer, and the second optical grating is configured to extract the fingerprint light ray in the light guiding layer to the detector module;
   the detector module is configured to detect a light intensity of the fingerprint light ray extracted from the light guiding layer by the second optical grating; and
   the detector module comprises a photosensitive layer and a light shielding layer, the photosensitive layer is between the light shielding layer and the light guiding layer, and the light shielding layer shields the photosensitive layer.

2. The fingerprint recognition device according to claim 1, wherein both the first optical grating and the second optical grating are in direct contact with the light guiding layer.

3. The fingerprint recognition device according to claim 1, wherein the first optical grating and the second optical grating are adjacent to each other and are on the same side of the light guiding layer.

4. The fingerprint recognition device according to claim 1, wherein the detector module is configured to detect only the fingerprint light ray extracted from the light guiding layer.

5. The fingerprint recognition device according to claim 1, wherein the second optical grating is on a side of the light guiding layer away from the first optical grating.

6. The fingerprint recognition device according to claim 1, wherein an orthographic projection of the second optical grating on the light guiding layer overlaps an orthographic projection of the detector module on the light guiding layer.

7. The fingerprint recognition device according to claim 1, wherein the preset angle range of the incident angle of the fingerprint light ray is from −7 degrees to +4 degrees.

8. The fingerprint recognition device according to claim 1, wherein the first optical grating each comprises a plurality of light entrance grating strips arranged side by side, and each of the plurality of light entrance grating strips is configured to diffractively couple the fingerprint light ray from a position corresponding to the each of the plurality of light entrance grating strips into the light guiding layer to allow the fingerprint light ray to be transmitted in the light guiding layer;
   the second optical grating each comprises a plurality of light exit grating strips arranged side by side, and each of the plurality of light exit grating strips is configured to extract the fingerprint light ray from the light guiding layer to the detector module to allow the light intensity of the fingerprint light ray to be detected by the detector module.

9. The fingerprint recognition device according to claim 8, wherein each of the plurality of light entrance grating strips is an inclined grating strip inclined with respect to the light guiding layer and each of the plurality of light exit grating strips is an inclined grating strip inclined with respect to the light guiding layer.

10. The fingerprint recognition device according to claim 9, wherein an included angle between each of the plurality of light entrance grating strips and a normal perpendicular to the light guiding layer is from 10 degrees to 30 degrees, an included angle between each of the plurality of light exit grating strips and the normal perpendicular to the light guiding layer is from 10 degrees to 30 degrees, a height of each of the plurality of light entrance grating strips with respect to the light guiding layer is from 400 nanometers to 500 nanometers, and a height of each of the plurality of light exit grating strips with respect to the light guiding layer is from 400 nanometers to 500 nanometers.

11. The fingerprint recognition device according to claim 1, wherein the light transmission substrate is an organic light-emitting diode (OLED) display substrate.

12. The fingerprint recognition device according to claim 11, wherein the OLED display substrate comprises a light transmission base layer and a light-emitting layer, the light-emitting layer is on a side of the plurality of first optical gratings away from the light guiding layer, and the light transmission base layer is on a side of the light-emitting layer away from the light guiding layer.

13. The fingerprint recognition device according to claim 1, wherein the light transmission substrate is an active light-emitting substrate.

14. The fingerprint recognition device according to claim 13, wherein the light guiding layer is on a back side of the active light-emitting substrate, and the back side is a side that does not emit light.

15. The fingerprint recognition device according to claim 1, wherein the fingerprint light ray guided into the light guiding layer by the first optical grating is totally reflected to the second optical grating by a surface which is comprised by the light guiding layer and is away from the first optical grating.

16. The fingerprint recognition device according to claim 1, wherein a thickness of the light guiding layer is less than or equal to 50 microns.

17. The fingerprint recognition device according to claim 1, wherein in a direction in which the plurality of recognizer units are arranged, a width of each of the plurality of recognizer units is less than a sum of a width of a fingerprint valley of a fingerprint and a width of a fingerprint ridge of the fingerprint.

18. A recognition device, comprising:
   a light transmission substrate;
   a light guiding layer, wherein the light guiding layer is on a side of the light transmission substrate; and
   a plurality of recognizer units, wherein the plurality of recognizer units are on the side of the light transmission substrate, and each of the recognizer units comprises a first optical grating, a second optical grating and a detector module;
   wherein
   the first optical grating is between the light guiding layer and the light transmission substrate, and the first optical grating is configured to diffractively couple a light ray passing through the light guiding substrate and having an incident angle within a preset angle range to the light guiding layer so that the light ray is transmitted in the light guiding layer;

the second optical grating is on a side of the light guiding layer, the detector module is on a side of the second optical grating away from the light guiding layer, and the second optical grating is configured to extract the light ray in the light guiding layer to the detector module;

the detector module is configured to detect a light intensity of the light ray extracted from the light guiding layer by the second optical grating; and the detector module comprises a photosensitive layer and a light shielding layer, the photosensitive layer is between the light shielding layer and the light guiding layer, and the light shielding layer shields the photosensitive layer.

19. A display device, comprising:
the fingerprint recognition device according to claim 1.

20. A fingerprint recognition device, comprising:
a light transmission substrate;
a light guiding layer, wherein the light guiding layer is on a side of the light transmission substrate; and
a plurality of recognizer units, wherein the plurality of recognizer units are on the side of the light transmission substrate, and each of the plurality of recognizer units comprises a first optical grating, a second optical grating and a detector module;
wherein the first optical grating is between the light guiding layer and the light transmission substrate, and the first optical grating is configured to diffractively couple a fingerprint light ray having an incident angle within a preset angle range to the light guiding layer so that the fingerprint light ray is transmitted in the light guiding layer;
the second optical grating is on a side of the light guiding layer, the detector module is on a side of the second optical grating away from the light guiding layer, and the second optical grating is configured to extract the fingerprint light ray in the light guiding layer to the detector module;

the detector module is configured to detect a light intensity of the fingerprint light ray extracted from the light guiding layer by the second optical grating;

the first optical grating each comprises a plurality of light entrance grating strips arranged side by side, and each of the plurality of light entrance grating strips is configured to diffractively couple the fingerprint light ray from a position corresponding to the each of the plurality of light entrance grating strips into the light guiding layer to allow the fingerprint light ray to be transmitted in the light guiding layer;

the second optical grating each comprises a plurality of light exit grating strips arranged side by side, and each of the plurality of light exit grating strips is configured to extract the fingerprint light ray from the light guiding layer to the detector module to allow the light intensity of the fingerprint light ray to be detected by the detector module;

each of the plurality of light entrance grating strips is an inclined grating strip inclined with respect to the light guiding layer and each of the plurality of light exit grating strips is an inclined grating strip inclined with respect to the light guiding layer; and an included angle between each of the plurality of light entrance grating strips and a normal perpendicular to the light guiding layer is from 10 degrees to 30 degrees, an included angle between each of the plurality of light exit grating strips and the normal perpendicular to the light guiding layer is from 10 degrees to 30 degrees, a height of each of the plurality of light entrance grating strips with respect to the light guiding layer is from 400 nanometers to 500 nanometers, and a height of each of the plurality of light exit grating strips with respect to the light guiding layer is from 400 nanometers to 500 nanometers.

* * * * *